United States Patent [19]

Tanaka et al.

[11] Patent Number: 5,504,058
[45] Date of Patent: Apr. 2, 1996

[54] OXIDE SUPERCONDUCTING DEVICE

[75] Inventors: Sou Tanaka; Mitsuchika Saitoh; Michitomo Iiyama, all of Osaka, Japan

[73] Assignee: Sumitomo Electric Industries, Ltd., Japan

[21] Appl. No.: 230,449

[22] Filed: Apr. 20, 1994

Related U.S. Application Data

[60] Continuation of Ser. No. 32,217, Mar. 17, 1993, abandoned, which is a division of Ser. No. 730,770, Jul. 16, 1991, Pat. No. 5,215,960.

[30] Foreign Application Priority Data

| Jul. 16, 1990 | [JP] | Japan | 2-187726 |
| Jul. 2, 1991 | [JP] | Japan | 3-188073 |
| Jul. 2, 1991 | [JP] | Japan | 3-188074 |

[51] Int. Cl.$^6$ .................................................... B32B 9/00
[52] U.S. Cl. ................ 505/190; 505/237; 505/234; 505/191; 428/688; 428/209; 257/35
[58] Field of Search ........................ 505/190, 191, 505/234, 235, 237, 238, 239; 257/35; 428/688, 209, 210, 689, 930

[56] References Cited

U.S. PATENT DOCUMENTS

| 4,970,197 | 11/1990 | Shiota | 606/702 |
| 5,047,385 | 9/1991 | Beasley | 505/1 |
| 5,047,390 | 9/1991 | Higashino | 505/702 |
| 5,087,605 | 2/1992 | Hegde | 505/1 |
| 5,126,315 | 6/1992 | Nishino | 505/703 |
| 5,151,408 | 9/1992 | Tanaka | 505/1 |
| 5,171,732 | 12/1992 | Hed | 505/1 |
| 5,283,465 | 2/1994 | Yamazaki | 505/704 |

FOREIGN PATENT DOCUMENTS

| 225236 | 6/1989 | Japan | 505/702 |

OTHER PUBLICATIONS

Howard, Appl. Phys. Lett. 33(12), Dec. 15, 1978 pp. 1034–1035.
Sahu et al, in Chemistry of High T, Supercond II 1988 ACS Chapter 1.
Doss, "Engineers Guide To High Temperature Superconductivity," Wiley & Sons, 1989, pp. 150–157, 226–269.
"Cuprate Superconductivity," May 10, 1993 C & EN, pp. 4–5.
"Paths to Higher Temperature Superconductors," Science, vol. 259, Mar. 12, 1993, pp. 1550–1551.
"Superconductors' Material Problems," Science vol. 240, Apr. 1, 1988, pp. 25–27.
Rogers, Appl Phys Lett. 55(19), 6 Nov. 89 pp. 2032–2034.

*Primary Examiner*—Patrick J. Ryan
*Assistant Examiner*—Patrick Jewik
*Attorney, Agent, or Firm*—Pennie & Edmonds

[57] ABSTRACT

In a method of manufacturing a superconducting device which has a first thin film of oxide superconductor material formed on a substrate and a second thin film formed on the first thin film of oxide superconductor material, after the second thin film is deposited on the first thin film of oxide superconductor material, a multi-layer structure formed of the first and second thin films is patterned so that a side surface of the first thin film is exposed. In this condition, the whole of the substrate is heated in an $O_2$ atmosphere or in an $O_3$ atmosphere so that oxygen is entrapped into the first thin film of oxide superconductor material. Thereafter, the patterned multi-layer structure is preferably covered with a protection coating.

4 Claims, 8 Drawing Sheets

OXIDE SUPERCONDUCTING DEVICE

This is a continuation of application Ser. No. 08/032,217, filed Mar. 17, 1993, now abandoned, which is a division of application Ser. No. 07/730,770, filed Jul. 16, 1991, now U.S. Pat. No. 5,215,960.

BACKGROUND OF THE INVENTION

1. Field of the Invention

The present invention relates to a method for manufacturing a superconducting device and a superconducting device manufactured thereby. More specifically, the present invention relates to a method for manufacturing a superconducting device by depositing a thin film such as non-superconductor material thin film or a semiconductor material thin film on an oxide superconductor material thin film formed on a substrate, and a novel superconducting device manufactured thereby.

2. Description of Related Art

In the case of using an oxide superconductor material in a superconducting device, it it necessary to form and stack a thin film of oxide superconductor material. For example, when a superconductor/non-superconductor/superconductor junction called a "tunnel type" Josephson junction is formed by using an oxide superconductor material, it is necessary to sequentially stack a first thin film of oxide superconductor material, a thin film of non-superconductor material, and a second thin film of oxide superconductor material in the named order.

In this tunnel type Josephson junction, a thickness of the non-superconductor material thin film is generally determined by a coherence length of the superconductor material. Since the oxide superconductor materials have a very short coherence length, it is necessary to cause the non-superconductor material thin film to have the thickness on the order of a few nanometers.

On the other hand, considering the characteristics of the device, each of the above mentioned three thin films has to have good crystallinity. Namely, all of the three thin films are preferred to be a single crystal, and if any one of the three thin films is polycrystalline or amorphous, a Josephson device cannot have a stable performance.

The good crystalline thin film is required not only in the above mentioned tunnel type Josephson junction device, but also in other devices including a superconducting transistor composed of an oxide superconductor material and a semiconductor material in combination.

However, if the oxide superconductor material thin film is exposed to air, it will lose both superconductivity and crystallinity to the extent of about 1 nm depth from its surface. In ordinary cases, in order to deposit a second thin film on the oxide superconductor material thin film, a deposition apparatus different from that used for formation of the oxide superconductor material thin film is used, and therefore, the oxide superconductor material thin film is inevitably exposed to air in the course of feeding from a deposition apparatus to another deposition apparatus. Because of this, it has been a conventional practice to heat the oxide superconductor material thin film at about 700° C. under an ultra high vacuum on the order of $1 \times 10^{-9}$ Torr, before the second thin film is deposited on the oxide superconductor material thin film.

The oxide superconductor material thin film subjected to the above mentioned heat-treatment can have a surface of an improved crystallinity, and in addition, it becomes possible to epitaxially grow the second thin film on the oxide superconductor material thin film. However, the heating of the oxide superconductor material thin film under the above mentioned ultra high vacuum will result in loss of oxygen from the oxide superconductor material crystal thin film, which will deteriorate or lose the superconduction characteristics.

On the other hand, if the heat treatment is performed in oxygen atmosphere, no deterioration will occur in superconduction characteristics of the oxide superconductor material thin film, but the crystallinity of the thin film surface is not improved. Therefore, it may be considered to perform the heat treatment in oxygen or ozone atmosphere after the second film is deposited on the oxide superconductor material thin film. However, even if the oxide superconductor material thin film is treated with this method, after the oxide superconductor material thin film is heated in a later step, oxygen will in some cases be lost again from the crystal of the oxide superconductor material thin film.

SUMMARY OF THE INVENTION

Accordingly, it is an object of the present invention to provide a method of manufacturing a superconducting device, which method has overcome the above mentioned defect of the conventional one.

Another object of the present invention is to provide a method of manufacturing a superconducting device having superior characteristics, without losing the superconductivity of an oxide superconductor material thin film.

Still another object of the present invention is to provide a superconducting device having superior characteristics and including an oxide superconductor material thin film of excellent superconductivity.

The above and other objects of the present invention are achieved in accordance with the present invention by a method of manufacturing a superconducting device which has a first thin film of oxide superconductor material formed on a substrate and a second thin film stacked on the first thin film of oxide superconductor material, the method including the steps of depositing the second thin film on the first thin film of oxide superconductor material, processing the first thin film so as to cause a side surface of the first thin film to be exposed, and thereafter, heating the whole of the substrate in an $O_2$ atmosphere or in an $O_3$ atmosphere.

According to a second aspect of the present invention, after the whole of the substrate is heated in an $O_2$ atmosphere or in an $O_3$ atmosphere so as to cause oxygen to be entrapped into an oxide superconductor material crystal forming the first thin film of oxide superconductor material, the whole of the first and second thin films is covered with a protection coating. This protection coating is preferably made of a noble metal.

According to a third aspect of the present invention, the protection coating is made of an oxide superconductor material layer formed of an oxide superconductor material crystal different in orientation from the oxide superconductor material crystal forming the first thin film of oxide superconductor material.

Furthermore, according to the present invention there is provided a superconducting device comprising a first oxide superconductor material thin film formed on a substrate, a non-superconductor material thin film formed on the first oxide superconductor material thin film, and a second oxide superconductor material thin film formed on the non-superconductor material thin film, side surfaces of the first oxide superconductor material thin film, the non-superconductor material thin film and the second oxide superconductor material thin film being coated with a thin film of noble metal, which functions as a resistor connecting between the first oxide superconductor material thin film and the second oxide superconductor material thin film.

As seen from the above, if a superconducting device, which includes an oxide superconductor material thin film formed on a substrate and a thin film such as an insulator thin film made of for example MgO (magnesium oxide) or a semiconductor thin film made of for example Si (silicon) formed on the oxide superconductor material thin film, is manufactured in accordance with the present invention, the following is a first important feature: After the stacked deposited thin films are patterned until a side surface of a lowermost oxide superconductor material thin film is exposed, the heating is performed in an $O_2$ atmosphere or in an $O_3$ atmosphere.

A second important feature of the invention is that: After the stacked thin films so patterned that a side surface of a lowermost oxide superconductor material thin film is exposed and heat-treated in an $O_2$ atmosphere or in an $O_3$ atmosphere so as to cause oxygen to be entrapped into the oxide superconductor material crystal forming the oxide superconductor material thin film, the whole of the patterned stacked thin films is covered with a protection coating which is formed of for example a noble metal. A third important feature of the invention is that the protection coating is constituted of an oxide superconductor material layer formed of an oxide superconductor material crystal different in orientation from the oxide superconductor material crystal forming the first named oxide superconductor material thin film.

The above mentioned method in accordance with the present invention is effective particularly in restoring an oxide superconductor material thin film in which oxygen in a crystal has been lost and superconductivity has been deteriorated. Specifically, the method in accordance with the present invention is very effective in the case of manufacturing a superconducting device, by heating in high vacuum an oxide superconductor material thin film having a surface crystallinity deteriorated for example due to exposure to air, so as to restore the surface crystallinity, and thereafter by epitaxially growing another thin film on the thin film having the restored surface crystallinity.

In the method of the present invention, since oxygen is entrapped or supplied into the inside of the thin film from the side surface exposed as the result of the patterning, the superconducting device manufactured in accordance with the method of the present invention has to have the patterned oxide superconductor material thin film of a shape and a size which allow a sufficient amount of oxygen to be supplied to a center portion of the oxide superconductor material thin film. For example, if the patterned oxide superconductor material thin film is rectangular in a plan view, a width of the patterned oxide superconductor material thin film (distance between opposite exposed side surfaces of the patterned oxide superconductor material thin film) is preferably not greater than 3 mm, more preferably not greater than 1 mm. However, this width of the patterned thin film is very general in current electronic devices. Therefore, superconducting devices which can be manufactured in accordance with the present invention are not substantially subjected to any limitations in size attributable to the present invention.

On the other hand, the oxide superconductor material has a general property in which oxygen is easier to move in a direction perpendicular to a "c"-axis of the crystal. Therefore, not only when oxygen is lost from the crystal, but also when oxygen is diffused and entrapped into the crystal, the oxygen moves mainly in a direction perpendicular to a "c"-axis. Accordingly, the superconducting device manufactured in accordance with the present invention is preferred to have a "c"-axis oriented oxide superconductor material thin film, which has a "c"-axis perpendicular to a surface (such as a surface of a substrate) on which the thin film is to be deposited.

In the method of the present invention, the heating temperature is preferably not less than 400° C. but not greater than 500° C. In addition, when the oxide superconductor material thin film is heat-treated in $O_2$ atmosphere, a partial pressure of $O_2$ is preferably not less than 5 Torr, and when the oxide superconductor material thin film is heat-treated in $O_3$ atmosphere, a partial pressure of $O_3$ is preferably not less than 0.1 Torr. If the heating temperature is less tan 400° C., the oxide superconductor material thin film cannot entrap a sufficient amount of oxygen, and if the heating temperature is greater than 500° C., diffusion will in some cases occur between adjacent thin films.

Furthermore, the partial pressures of $O_2$ and $O_3$ have a closed relation to the heating temperature. It can be generally said that if the heating temperature is high, the partial pressures of $O_2$ and $O_3$ must also be high. For example, if the oxide superconductor material thin film is heated at 400° C. in the $O_2$ atmosphere, the partial pressure of $O_2$ is preferred to be within a range of 5 Torr to 20 Torr. However, when the oxide superconductor material thin film is heated at 500° C. in the $O_2$ atmosphere, if the partial pressure of $O_2$ were less than 10 Torr, it is not possible to cause oxygen to be sufficiently entrapped into the oxide superconductor material thin film. In addition, when the oxide superconductor material thin film is heated at 500° C. in the $O_3$ atmosphere, if the partial pressure of $O_3$ were less than 10 Torr, a sufficient amount of oxygen cannot be entrapped into the oxide superconductor material thin film.

As mentioned above, according to the second aspect of the present invention, the whole of the stacked thin films is covered with a protection coating after oxygen has been entrapped into the oxide superconductor material thin film. The protection coating is formed of for example a noble metal, preferably Au (gold) or Ag (silver) which has a low reactivity to the oxide superconductor material. In addition, the noble metal coating is preferred to have a thickness of not less than 10 nm but not greater than 50 nm.

With the stacked thin films being covered with the protection coating, even if the oxide superconductor material thin film is heated in a later step, oxygen is not lost from the oxide superconductor material crystal. In addition, it is possible to prevent impurity from entering into the oxide superconductor material thin film from materials in contact with or surrounding the oxide superconductor material thin film. Therefore, the superconducting device manufactured in accordance with the second aspect of the present invention can effectively retain superior characteristics of the oxide superconductor material thin film without being deteriorated, and therefore, can have a high performance.

The noble metal coating can be formed by a sputtering, a vacuum evaporation, or any other method. In this connection, attention should be given to ensure that, when the protection coating is formed, the oxide superconductor material thin film is avoided from passing through or attaining to a temperature zone in which oxygen is lost from the oxide superconductor material crystal (for example, about 400° C. in the case of Y-Ba-Cu-O type oxide superconductor material). In other words, it is necessary to deposit the protection coating of for example a noble metal under a temperature which is below the above mentioned temperature zone.

According to the third aspect of the present invention, after the oxide superconductor material has been caused to entrap oxygen, the whole of the stacked thin films is covered with a layer formed of an oxide superconductor material crystal different in orientation from the oxide superconductor material crystal thin film. This layer formed of the oxide superconductor material crystal different in orientation from the oxide superconductor material crystal thin film behaves as an electrical insulator, different from the oxide superconductor material crystal thin film, and therefore, functions as a protection coating. In the case of manufacturing the superconducting device by using the "c"-axis oriented oxide superconductor material crystal thin film as mentioned hereinbefore, the protection coating of the oxide superconductor material layer is preferably formed of a so called "a"-axis oriented oxide superconductor material crystal thin film, which has an "a"-axis perpendicular to the surface on which the "c"-axis oriented oxide superconductor material crystal thin film is deposited. Therefore, the "c"-axis of the "a"-axis oriented oxide superconductor material crystal thin film is perpendicular to the "c"-axis of the "c"-axis oriented oxide superconductor material crystal thin film. Preferably, this oxide superconductor material protection coating has a thickness in a range of 10 nm to 50 nm.

As mentioned hereinbefore oxygen in the oxide superconductor material crystal is easier to move in a direction perpendicular to the "c"-axis, but hardly moves in a direction parallel to the "c"-axis. Accordingly, oxygen in the "c"-axis oriented oxide superconductor material crystal (forming the oxide superconductor material thin film) covered with the "a"-axis oriented oxide superconductor material crystal protection layer is difficult to pass through the "a"-axis oriented oxide superconductor material crystal protection layer, and therefore, almost no oxygen will be lost from the "c"-axis oriented oxide superconductor material crystal thin film. In addition, impurity is prevented from entering into the oxide superconductor material thin film from materials in contact with the oxide superconductor material thin film.

Furthermore, the "a"-axis oriented oxide superconductor material crystal protection layer has the "c"-axis perpendicular to the side surface of the "c"-axis oriented oxide superconductor material crystal thin film. Since the oxide superconductor material crystal is apt to easily deform in the "c"-axis direction, distortion caused by a difference in thermal expansion coefficient between the oxide superconductor material thin film and materials in contact with or surrounding the oxide superconductor material thin film will be absorbed by the "a"-axis oriented oxide superconductor material crystal protection layer.

Thus, even if the oxide superconductor material thin film is heated in a later step, the characteristics of the oxide superconductor material thin film is maintained.

As seen from the above, particularly, the "a"-axis oriented oxide superconductor material crystal protection layer functions as (1) a buffer for absorbing a mechanical stress, (2) a barrier for preventing the mutual diffusion between adjacent layers and the loss of oxygen, and (3) an electrical insulator. Therefore, the degree of freedom of working or processing in later steps of the manufacturing process can be increased. Accordingly, the superconducting device manufactured in accordance with the third aspect of the present invention can effectively retain superior characteristics of the oxide superconductor material thin film without being deteriorated, and therefore, can have a high performance.

The "a"-axis oriented oxide superconductor material crystal protection layer can be formed by a sputtering or other various methods having a growth isotropy. For the sputtering having a growth isotropy, a formation temperature (generally, the substrate temperature) is about 650° C. or less in the case of the Y-Ba-Cu-O type oxide superconductor material. Accordingly, it is preferred that immediately after the processing for causing oxygen to be entrapped into the oxide superconductor material thin film has been completed, the substrate temperature is elevated and the "a"-axis oriented oxide superconductor material crystal protection layer is formed.

The novel superconducting device, which can be formed in accordance with the method of the present invention, can be realized in the form of, for example, a Josephson device or a superconducting transistor, both of which have the first oxide superconductor material thin film, the non-superconductor material thin film and the second oxide superconductor material thin film formed or stacked on the substrate in the named order, a side surface of the stacked layers being covered with a noble metal layer which electrically interconnects between the first and second oxide superconductor material thin films and which acts as a resistive element. Since the first and second oxide superconductor material thin films separated by the non-superconductor material thin film are electrically interconnected by the noble metal layer, a hysteresis which has been expressed without exception in conventional superconducting devices of this type will be cancelled. Accordingly, it is possible to easily construct a superconducting quantum interference device (SQUID) when the superconducting device is incorporated in magnetic circuits.

The method of the present invention can be applied to any arbitrary oxide superconductor material. But, $Y_1Ba_2Cu_3O_{7-x}$ ($0 \leq x < 1$) type oxide superconductor is preferred, since a thin film having a high quality and a good crystallinity can be stably obtained. In addition, $Bi_2Sr_2Ca_2Cu_3O_y$ ($7 \leq y \leq 11$) type oxide superconductor is preferred, since it has a high superconduction critical temperature Tc.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Figure 1A:
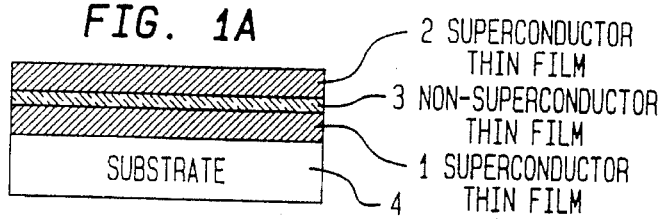
FIGS. 1A to 1J are diagrammatic sectional views and plan views for illustrating various steps of the first embodiment of the method in accordance with the present invention for manufacturing a superconducting device.

A Josephson device was formed in accordance with each of the method of the present invention and the prior art method, by depositing or stacking a first oxide superconductor material thin film, a $SrTiO_3$ thin film, a second oxide superconductor material thin film on a MgO substrate in the named order. The process will be described with reference to FIGS. 1A to 1J.

First, a $Y_1Ba_2Cu_3O_{7-x}$ superconducting thin film (which will become a first oxide superconductor material thin film 1) was deposited on a (100) surface of an MgO substrate 4 by a sputtering. The deposition condition is as follows:

| substrate temperature | 700° C. |
|---|---|
| sputtering gas | |
| Ar | 90% |
| $O_2$ | 10% |
| pressure | $5 \times 10^{-2}$ Torr |
| film thickness | 400 nm |

Then, the MgO substrate having the deposited first oxide superconductor material thin film 1 was moved or placed in a vacuum evaporation apparatus from a sputtering apparatus, and a surface crystallinity restoring treatment (heat-treatment) was performed under the following condition:

| pressure | $1 \times 10^{-9}$ Torr |
|---|---|
| substrate temperature | 700° C. |
| treatment time | 3 minutes |

After the above treatment, the substrate is allowed to cool until 400° C., and thereafter, an $SrTiO_3$ thin film (which will become a non-superconductor material thin film 3) was deposited on the oxide superconductor material thin film 1 by an ion-beam sputtering under the following condition:

| substrate temperature | 700° C. |
|---|---|
| oxygen pressure | $4 \times 10^{-6}$ Torr |
| film thickness | 3 nm |

Furthermore, a $Y_1Ba_2Cu_3O_{7-x}$ superconducting thin film (which will become a second oxide superconductor material thin film 2) was deposited on the $SrTiO_3$ thin film 3 by a laser ablation method under the following condition:

| substrate temperature | 700° C. |
|---|---|
| oxygen pressure | 10 Torr |
| film thickness | 400 nm |

Thus, a three-layer structure as shown in FIG. 1A was formed on the MgO substrate 4. At this stage, the oxide superconductor material of the second oxide superconductor material thin film 2 had a composition of $Y_1Ba_2Cu_3O_{6.9}$, but the oxide superconductor material of the first oxide superconductor material thin film 1 had a composition of $Y_1Ba_2Cu_3O_{6.4}$, because of influence of the above mentioned heat treatment. In addition, the first and second oxide superconductor material thin films 1 and 2 were formed of a "c"-axis oriented crystal, and the $SrTiO_3$ layer 3 was substantially formed of a single crystal.

Figure 1B:
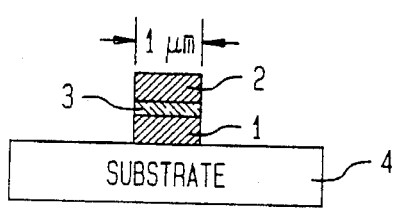
Figure 1C:
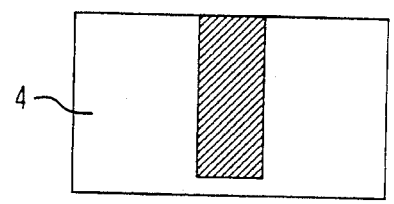

Thereafter, the three-layer structure as shown in FIG. 1A formed of the first oxide superconductor material thin film 1, the $SrTiO_3$ thin film 3, and the second oxide superconductor material thin film 2 stacked in the named order, was patterned by using a photolithography and an Ar-ion etching, so that a linear pattern having a width of 1 μm is formed as shown in FIGS. 1B and 1C. FIG. 1C is a top plan view of the substrate shown in FIG. 1B.

After the above mentioned patterning, the heat treatment was performed in oxygen atmosphere. The following is the heat treatment condition:

| substrate temperature | 400° C. |
|---|---|
| $O_2$ partial pressure | 10 Torr |
| treatment time | 4 hours |

As the result of this heat treatment, the oxide superconductor material of the first oxide superconductor material thin film 1 had become a composition of $Y_1Ba_2Cu_3O_{6.9}$.

Figure 1D:
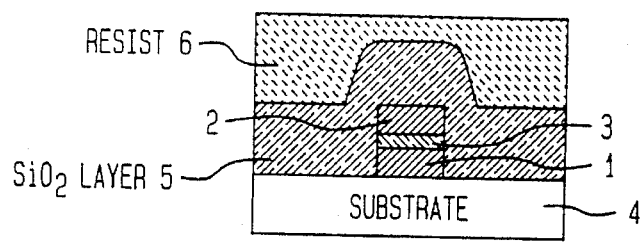
Figure 1E:
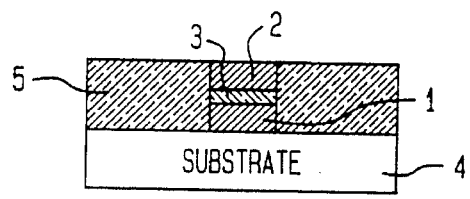

After the above mentioned treatment, a $SiO_2$ layer 5 having a thickness of 800 nm was deposited to cover the whole of the substrate, and a resist layer 6 was deposited to cover the $SiO_2$ layer 5, as shown in FIG. 1D. Then, the deposited resist layer 6 and $SiO_2$ layer 5 were etched back by a reactive ion etching process, until an upper surface of the second oxide superconductor material thin film 2 is exposed as shown in FIG. 1E.

Figure 1F:
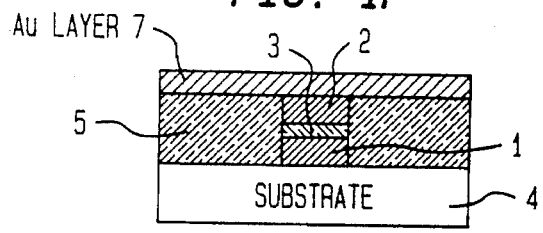
Figure 1G:
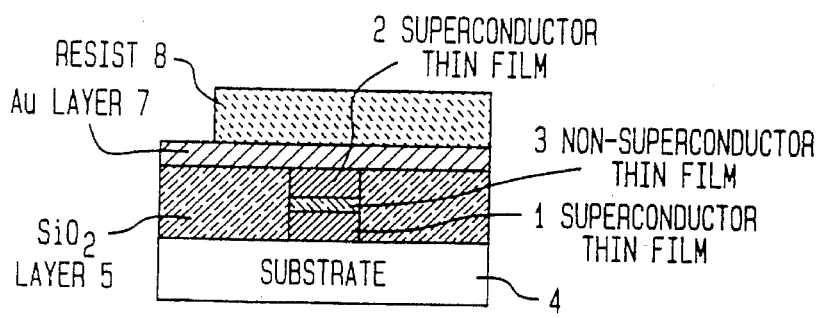
Figure 1H:
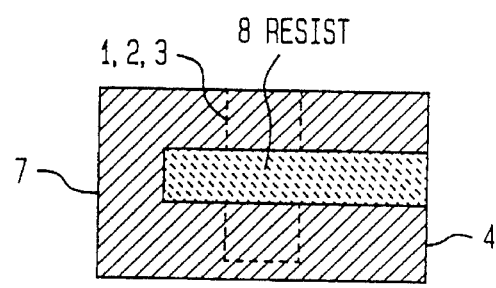

Furthermore, an Au layer 7 was deposited so as to cover the whole of an upper surface of the substrate by a vacuum evaporation, as shown in FIG. 1F. As shown in FIGS. 1G and 1H, a patterned linear resist 8 was formed on the deposited Au layer 7 so as to intersect the linear patterned three-layer structure formed of the oxide superconductor material thin films 1 and 2 and the $SrTiO_3$ thin film 3, in a plan view shown in FIG. 1H. The patterned linear resist 8 was 1 μm in width.

Figure 1I:
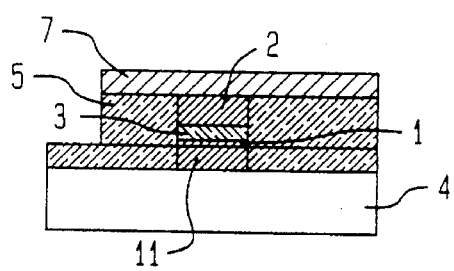
Figure 1J:
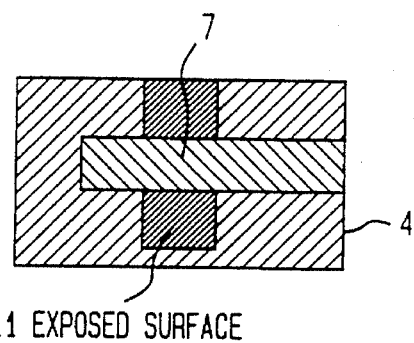

An Ar-ion milling was performed using the patterned linear resist 8 as a mask, until the linear patterned three-layer structure which was not covered with the patterned linear resist 8 becomes about a half in thickness, namely until the lower or first oxide superconductor material thin film 1 has an exposed upper surface 11, as shown in FIGS. 1I and 1J. In addition, a metallization layer was formed on the exposed upper surface 11 of the lower or first oxide superconductor material thin film 1.

Thus, a Josephson device was completed, in which the patterned Au layer 7 forms one of a pair of electrodes, and the metallization layer formed on the exposed upper surface 11 of the lower or first oxide superconductor material thin film 1 forms the other of the pair of electrodes.

After the completion of the device, crystallinity condition of the first and second oxide superconductor material thin films 1 and 2 and the $SrTiO_3$ layer 3 was examined. All of the three layers in the Josephson device manufactured in accordance with the present invention had good crystallinity. In addition, both of the first and second oxide superconductor material thin films 1 and 2 were formed of a "c"-axis oriented crystal. The critical temperatures Tc of the first and second oxide superconductor material thin films 1 and 2 were 90K and 89K, respectively.

In the Josephson device manufactured in the conventional process which does not include the step of the heat treatment in the oxygen atmosphere, on the other hand, the first oxide superconductor material thin film 1 had a composition of $Y_1Ba_2Cu_3O_{6.4}$, and did not show superconductivity at a liquid nitrogen temperature.

Embodiment 2

The same processings as those of the Embodiment 1 were performed until the three-layer structure etched to have a linear pattern having the width of 1 μm as shown in FIGS. 1B and 1C has been heat-treated in the oxygen atmosphere.

Figure 2A:
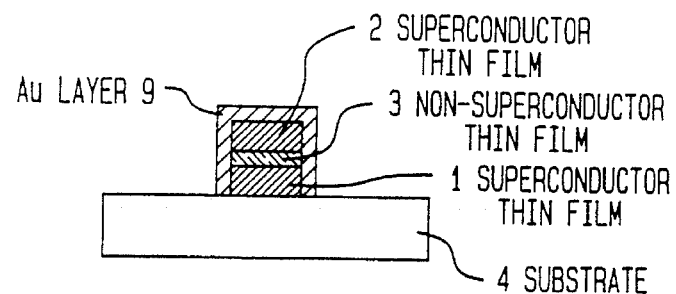
FIGS. 2A to 2H are diagrammatic sectional views and plan views for illustrating various steps of the second embodiment of the method in accordance with the present invention for manufacturing a superconducting device.

After the heat treatment, an Au layer 9 is deposited by a sputtering so as to cover the linear patterned three-layer structure formed of the first and second oxide superconductor material thin films 1 and 2 and the SrTiO₃ layer 3, as shown in FIG. 2A. The deposition condition is as follows:

| | |
|---|---|
| substrate temperature | 340° C. |
| sputtering gas Ar | 100% |
| pressure | $5 \times 10^{-2}$ Torr |
| film thickness | 30 nm |

In this case, the substrate temperature is made as low as possible in the range of not greater than 400° C. The reason for this that, at about 400° C. and and in the proximity thereof, oxygen in the $Y_1Ba_2Cu_3O_{6.9}$ superconductor crystals, which constitute the first and second oxide superconductor material thin films 1 and 2, respectively, is easiest to diffuse and lost.

Figure 2B:
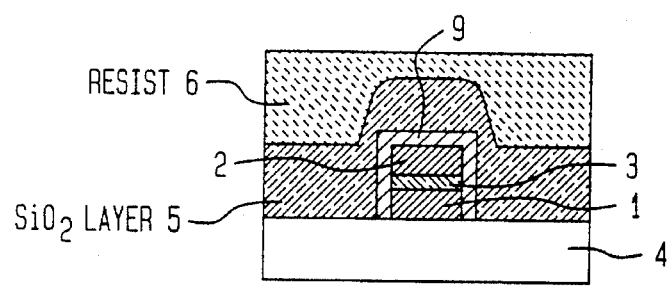
Figure 2C:
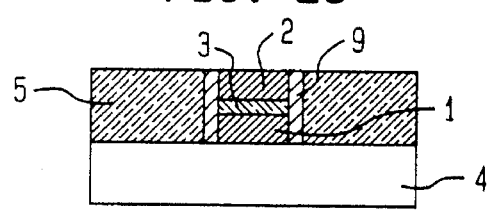

After the linear patterned three-layer structure formed of the first and second oxide superconductor material thin films 1 and 2 and the SrTiO₃ layer 3 was covered with the Au layer 9, a SiO₂ layer 5 having a thickness of 800 nm was deposited to cover the whole of the substrate, and a resist layer 6 was deposited to cover the SiO₂ layer 5, as shown in FIG. 2B. Then, the deposited resist layer 6 and SiO₂ layer 5 were etched back by a reactive ion etching process, until an upper surface of the second oxide superconductor material thin film 2 is exposed as shown in FIG. 2C.

Figure 2D:
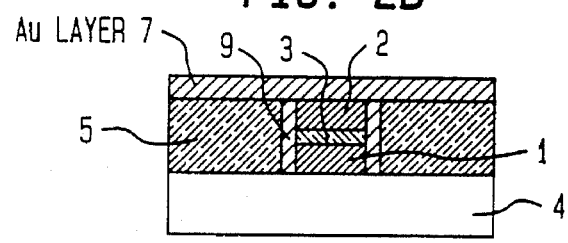
Figure 2E:
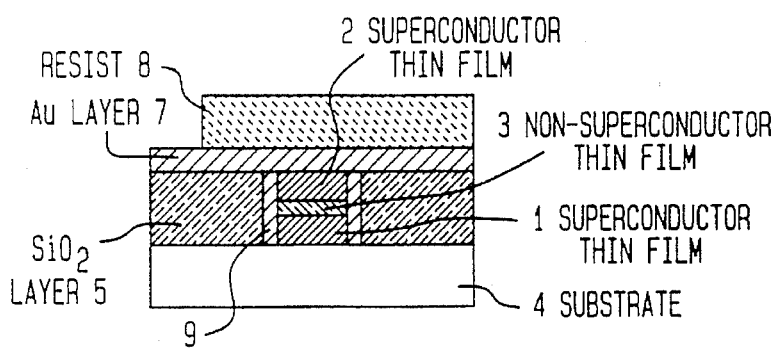
Figure 2F:
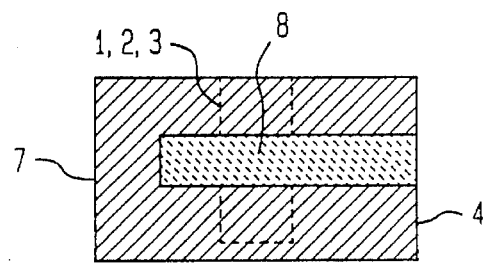

Furthermore, as shown in FIG. 2D, an Au layer 7 was deposited by a vacuum evaporation so as to cover the whole of an upper surface of the substrate. As shown in FIGS. 2E and 2F, a patterned linear resist 8 was formed on the deposited Au layer 7 so as to intersect the linear patterned three-layer structure formed of the oxide superconductor material thin films 1 and 2 and the insulator layer 3, in a plan view shown in FIG. 2F. The patterned linear resist 8 was 1 μm in width.

Figure 2G:
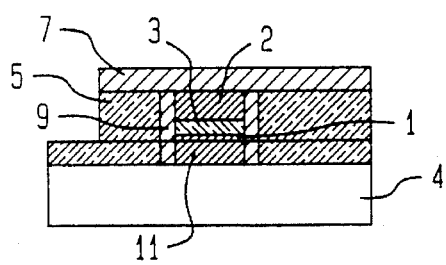
Figure 2H:
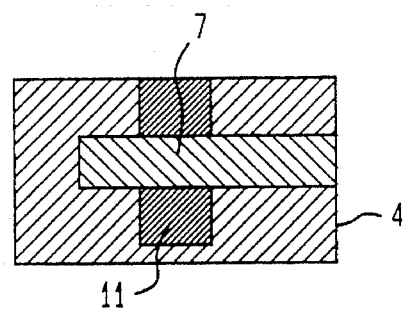

An Ar-ion milling was performed using the patterned linear resist 8 as a mask, until the linear patterned three-layer structure which was not covered with the patterned linear resist 8 becomes about a half in thickness, namely until the lower or first oxide superconductor material thin film 1 has an exposed upper surface 11, as shown in FIGS. 2G and 2H. In addition, a metallization layer was formed on the exposed upper surface 11 of the lower or first oxide superconductor material thin film 1.

Thus, a Josephson device was completed, in which the patterned Au layer 7 forms one of a pair of electrodes, and the metallization layer formed on the exposed upper surface 11 of the lower or first oxide superconductor material thin film 1 forms the other of the pair of electrodes.

After the completion of the device, crystallinity condition of the first and second oxide superconductor material thin films 1 and 2 and the SrTiO₃ layer 3 in the Josephson device manufactured in accordance with the present invention was examined. All of the three layers had good crystallinity. In addition, both of the first and second oxide superconductor material thin films 1 and 2 were formed of a "c"-axis oriented crystal. The first and second oxide superconductor material thin films 1 and 2 had the critical temperatures Tc of 90K and 89K, respectively.

In the Josephson device manufactured in the conventional process which does not include the step of the heat treatment in the oxygen atmosphere, on the other hand, the first oxide superconductor material thin film 1 had a composition of $Y_1Ba_2Cu_3O_{6.4}$, and did not show superconductivity at a liquid nitrogen temperature.

Figure 3A:
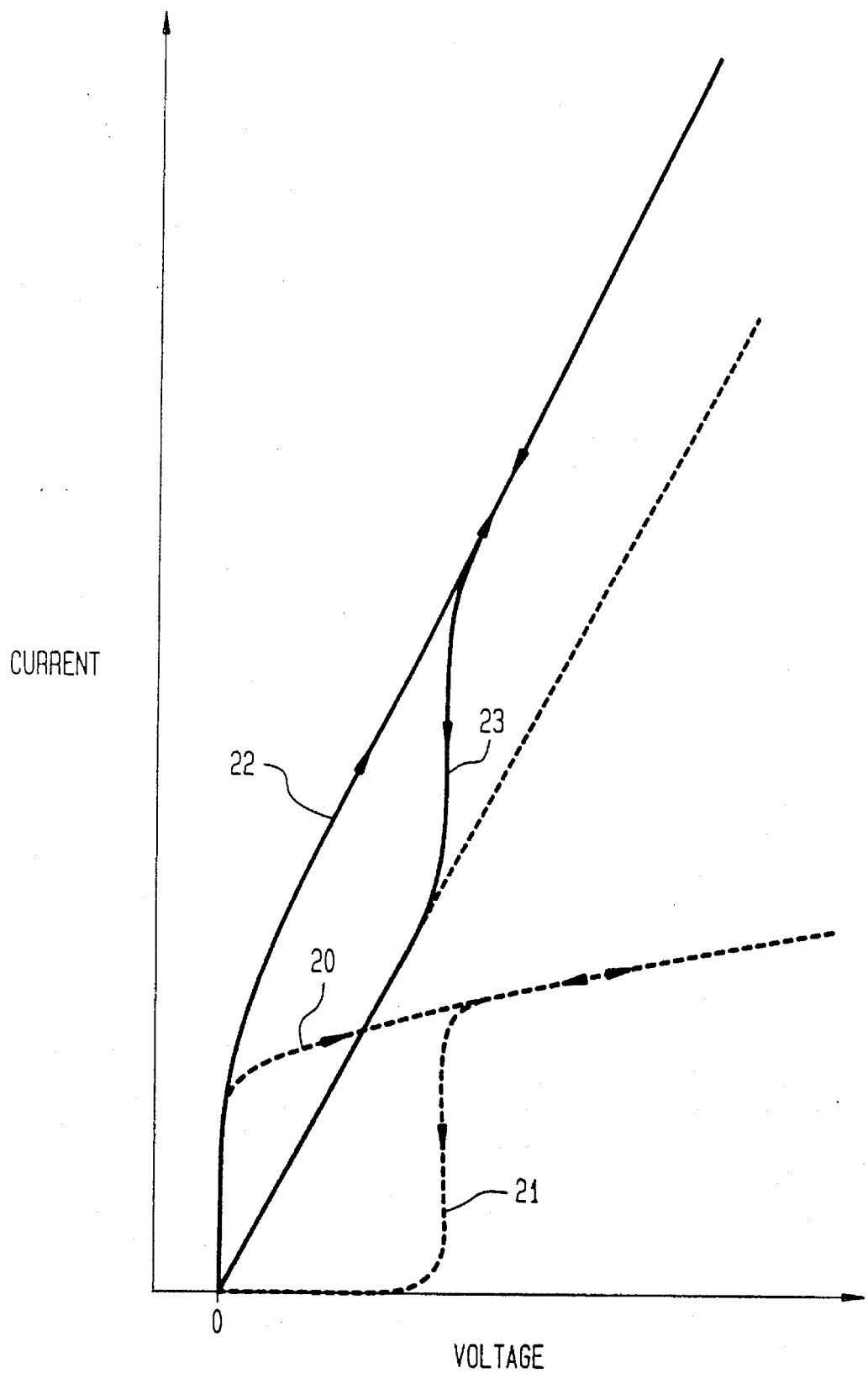
FIGS. 3A and 3B are a graph showing the current-voltage characteristics of the superconducting device manufactured in accordance with the second embodiment of the method of the present invention.
Figure 3B:
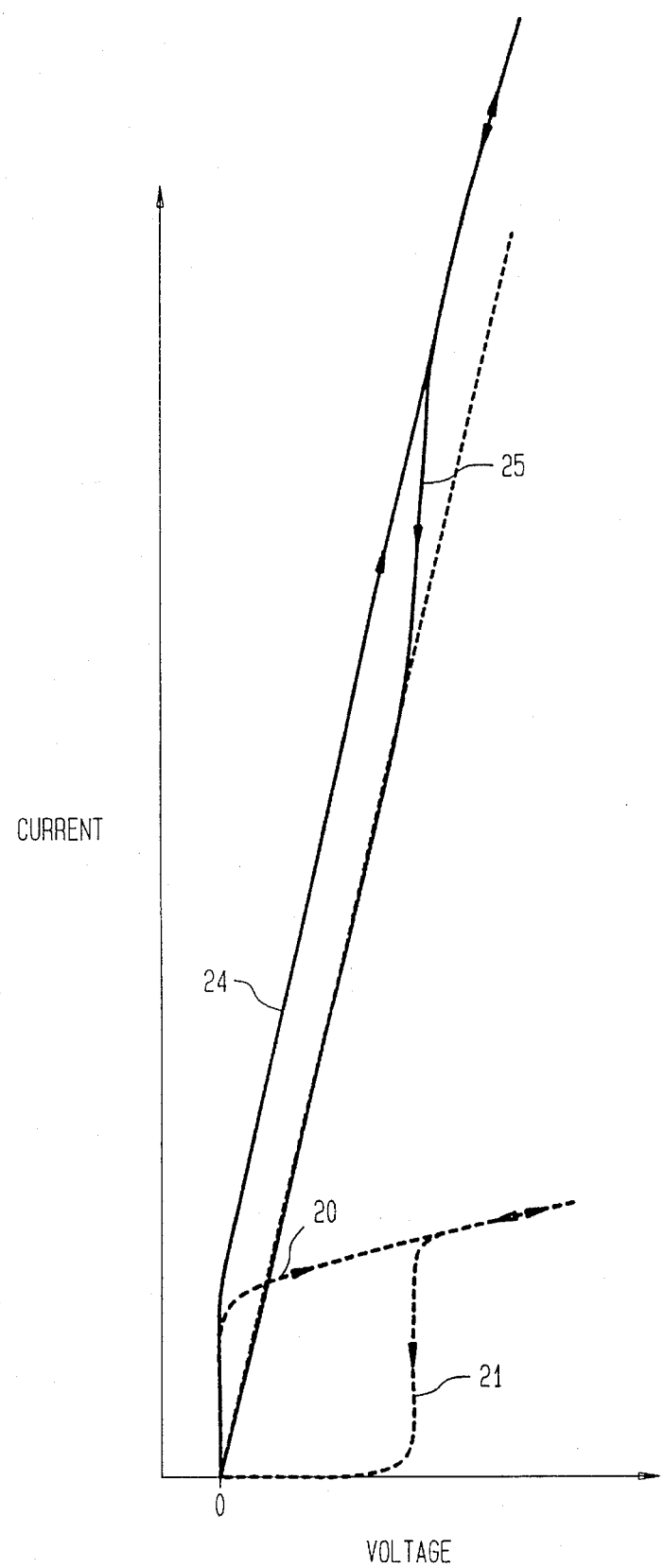

Furthermore, the characteristics of a superconducting device (Josephson device) manufactured in accordance with the Embodiment 2 was measured. The result is shown in FIGS. 3A and 3B. In each of FIGS. 3A and 3B, a curved dotted line shows a current-voltage characteristics of a Josephson device in the case that the protection coating 10 is not provided. The curved dotted line 20 shows the current-voltage characteristics of the Josephson device when the voltage is increased, and the curved dotted line 21 shows the current-voltage characteristics of the Josephson device when the voltage is decreased. A straight dotted line shows a current-voltage characteristics of the protection coating 10. As seen from comparison between FIGS. 3A and 3B, the protection coating 10 shown in FIG. 3B has a resistance lower than that of the protection coating 10 shown in FIG. 3A. A solid line a current-voltage characteristics of a Josephson device in the case that the protection coating 10 is provided in accordance with the Embodiment 2 of the invention.

In the case that the protection coating 10 having the current-voltage characteristics as shown by the straight dotted line in FIG. 3A is provided, the Josephson device manufactured in accordance with the Embodiment 2 has a current-voltage characteristics as shown by the solid line, which is determined by a combination of the current-voltage characteristics of the Josephson device and the current-voltage characteristics of the protection coating 10. When the voltage is increased, the current increases in accordance with the current-voltage characteristics curve 22, and when the voltage is decreased, the current decreases in accordance with the current-voltage characteristics curve 23. On the other hand, when the protection coating 10 having a low resistance as shown by the straight dotted line in FIG. 3B is provided, the Josephson device manufactured in accordance with the Embodiment 2 has a current-voltage characteristics shown in the solid line, in which when the voltage is increased, the current increases in accordance with the current-voltage characteristics curve 24, and when the voltage is decreased, the current decreases in accordance with the current-voltage characteristics curve 25.

As seen from the above, the Josephson device manufactured in accordance with the Embodiment 2 has a current-voltage characteristics having less hysteresis, and therefore, has high possibility of practical application. Further resistance adjustment will compensate the hysterics phenomena at all.

Embodiment 3

The same processings as those of the Embodiment 1 were performed until the three-layer structure etched to have a linear pattern having the width of 1 μm as shown in FIGS. 1B and 1C has been heat-treated in the oxygen atmosphere.

Figure 4A:
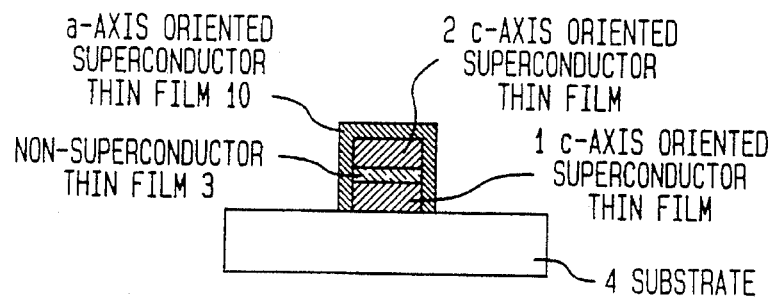
FIGS. 4A to 4H are diagrammatic sectional views and plan views for illustrating various steps of the third embodiment of the method in accordance with the present invention for manufacturing a superconducting device.

After the heat treatment, an "a"-axis oriented layer 10 of $Y_1Ba_2Cu_3O_{7-x}$ is deposited by a sputtering so as to cover the linear patterned three-layer structure formed of the first and second oxide superconductor material thin films 1 and 2 and the SrTiO₃ layer 3, as shown in FIG. 4A. The deposition condition is as follows:

| | |
|---|---|
| substrate temperature | 640° C. |
| sputtering gas | |
| Ar | 90% |
| $O_2$ | 10% |
| pressure | $4 \times 10^{-2}$ Torr |
| film thickness | 30 nm |

In the case of forming the "a"-axis oriented $Y_1Ba_2Cu_3O_{7-x}$ thin film, it is preferred that the substrate temperature is not greater than about 650° C., and the pressure is in the range of 10 mTorr to 50 mTorr.

Figure 4B:
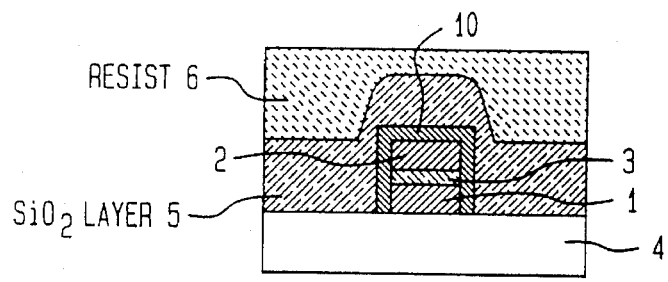
Figure 4C:
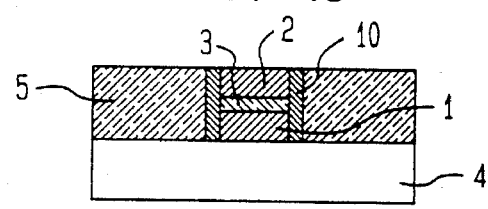

After the linear patterned three-layer structure formed of the first and second oxide superconductor material thin films 1 and 2 and the $SrTiO_3$ layer 3 was covered with the "a"-axis oriented $Y_1Ba_2Cu_3O_{7-x}$ layer 10, a $SiO_2$ layer 5 having a thickness of 800 nm was deposited to cover the whole of the substrate, and a resist layer 6 was deposited to cover the $SiO_2$ layer 5, as shown in FIG. 4B.

Figure 4D:
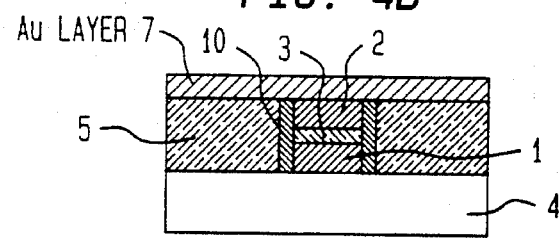
Figure 4E:
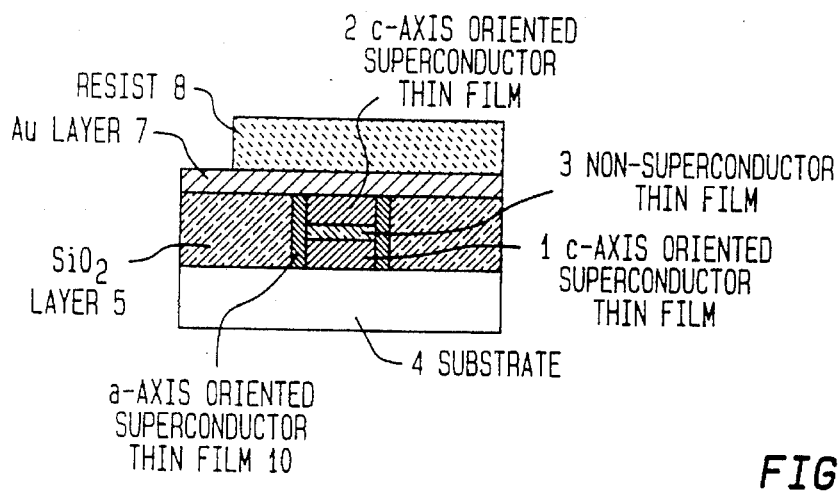
Figure 4F:
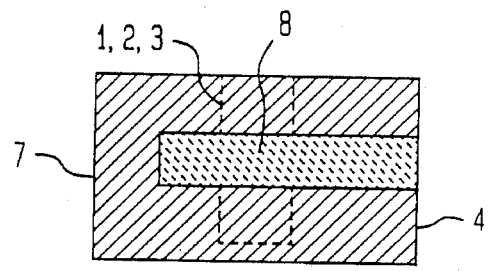
Figure 4G:
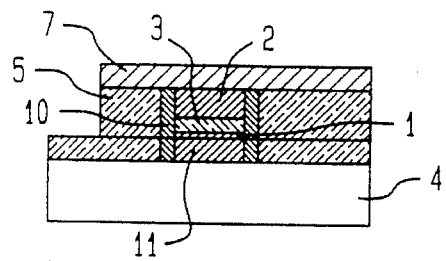
Figure 4H:
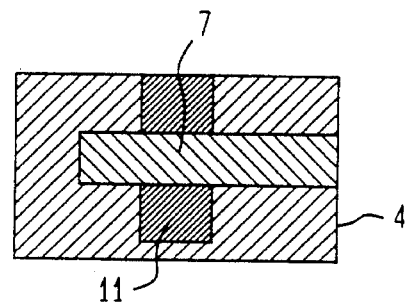

Thereafter, the same processings as those of the Embodiment 2 were executed as seen from FIGS. 4D, 4E and 4F, and a Josephson device as shown in FIGS. 4G and 4H was completed.

After the completion of the device, crystallinity condition of the first and second oxide superconductor material thin films 1 and 2 and the $SrTiO_3$ layer 3 in the Josephson device manufactured in accordance with the present invention was examined. All of the three layers had good crystallinity. In addition, both of the first and second oxide superconductor material thin films 1 and 2 were formed of a "c"-axis oriented crystal, and the $Y_1Ba_2Cu_3O_{7-x}$ thin film 10 was formed of an "a"-axis oriented crystal having an "a"-axis perpendicular to the surface of the substrate 4. The first and second oxide superconductor material thin films 1 and 2 had the critical temperatures of 90 K. and 89 K., respectively.

In the Josephson device manufactured in the conventional process which does not include the step of the heat treatment in the oxygen atmosphere, on the other hand, the first oxide superconductor material thin film 1 had a composition of $Y_1Ba_2Cu_3O_{6.4}$, and did not show superconductivity at a liquid nitrogen temperature.

As seen from the above, according to the method of the present invention, it is possible to manufacture a superconducting device such as a tunnel type Josephson device having a high performance, utilizing the advantages of the oxide superconductor material without being deteriorated. In addition, it is possible to manufacture a Josephson device having an improved hysteresis. Accordingly, it would be expected to promote application of oxide superconductor materials to electronic devices.

In the above mentioned embodiments, the non-superconductor material sandwiched between the first and second oxide superconductor material thin films 1 and 2 was formed of an insulator material such as $SrTiO_3$, and therefore, a so-called SIS type Josephson junction device was realized. However, it should be noted that the non-superconductor material sandwiched between the first and second oxide superconductor material thin films 1 and 2 can be formed of any other non-superconductor material such as a semiconductor material and a normal conductor material which have a low or poor reactivity to the oxide superconduction material being used.

The invention has thus been shown and described with reference to the specific embodiments. However, it should be noted that the present invention is in no way limited to the details of the illustrated structures but changes and modifications may be made within the scope of the appended claims.

We claim:

1. A superconducting device comprising:
   a first layer of Y-Ba-Cu-O or Bi-Sr-Ca-Cu-O oxide superconductor material formed on a surface of a MgO substrate;
   a separation layer of $SrTiO_3$ formed on said first layer;
   a second layer of Y-Ba-Cu-O or Bi-Sr-Ca-Cu-O oxide superconductor material formed on said separation layer; and
   a protection layer covering side surfaces of the three-layer structure, wherein said protection layer is comprised of Y-Ba-Cu-O or Bi-Sr-Ca-Cu-O oxide superconductor material having an orientation other than each of said first and second layers of oxide superconductor materials.

2. The superconducting device of claim 1, wherein said three-layer structure has a width which is not greater than 3 μm.

3. The superconducting device of claim 1, wherein each one of the first and second layers of oxide superconductor materials has a crystal structure with "c"-axis perpendicular to said surface of said substrate.

4. The superconducting device of claim 1, wherein each one of said first and second layers of oxide superconductor materials has a crystal structure with "c"-axis perpendicular to said surface of said substrate, and said protection layer has a crystal structure with "a"-axis perpendicular to said surface of said substrate.

* * * * *